(12) United States Patent
Jaffe

(10) Patent No.: US 7,477,326 B2
(45) Date of Patent: Jan. 13, 2009

(54) HDTV CHIP WITH A SINGLE IF STRIP FOR HANDLING ANALOG AND DIGITAL RECEPTION

(75) Inventor: Steven Todd Jaffe, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 135 days.

(21) Appl. No.: 11/197,735

(22) Filed: Aug. 2, 2005

(65) Prior Publication Data

US 2005/0280742 A1 Dec. 22, 2005

Related U.S. Application Data

(63) Continuation-in-part of application No. 10/448,062, filed on May 30, 2003, which is a continuation-in-part of application No. 09/739,349, filed on Dec. 15, 2000.

(60) Provisional application No. 60/401,043, filed on Aug. 6, 2002.

(51) Int. Cl.
H04N 5/455 (2006.01)
(52) U.S. Cl. ........................ 348/726; 348/725; 348/738; 348/555
(58) Field of Classification Search ......... 348/725–726, 348/553–555, 738, 345, 705, 706, 734; 375/316, 375/345; 725/127, 38, 128; H04N 5/455, H04N 5/44
See application file for complete search history.

(56) References Cited

U.S. PATENT DOCUMENTS

| | | | | | |
|---|---|---|---|---|---|
| 4,918,531 | A | * | 4/1990 | Johnson | 348/565 |
| 4,996,597 | A | * | 2/1991 | Duffield | 348/705 |
| 6,147,713 | A | * | 11/2000 | Robbins et al. | 348/555 |
| 6,369,857 | B1 | * | 4/2002 | Balaban et al. | 348/555 |
| 6,542,725 | B2 | * | 4/2003 | Armbruster et al. | 455/307 |
| 6,545,723 | B1 | * | 4/2003 | Han | 348/555 |
| 6,678,011 | B2 | * | 1/2004 | Yanagi et al. | 348/725 |
| 6,924,848 | B2 | * | 8/2005 | Onomatsu | 348/732 |
| 6,963,623 | B2 | * | 11/2005 | Ninomiya et al. | 375/326 |
| 7,039,941 | B1 | * | 5/2006 | Caporizzo et al. | 725/127 |

\* cited by examiner

*Primary Examiner*—Trang U Tran
(74) *Attorney, Agent, or Firm*—McAndrews, Held & Malloy, Ltd.

(57) ABSTRACT

Methods and systems for processing television signals are disclosed herein, and may comprise communicating analog and digital intermediate frequency (IF) signals via a single processing path that couples a TV radio frequency (RF) tuner to an IF demodulator and/or to a decoder, that processes said analog and digital IF signals. The analog and digital IF signals may be filtered via a surface acoustic wave (SAW) filter, for example. The filtered analog and digital IF signals may be amplified. The amplified filtered analog and digital IF signals may be received. The amplified filtered analog and digital IF signals may be IF demodulated by the IF demodulator to generate an IF demodulated output signal. An audio portion of the IF demodulated output signal may be decoded via a BTSC decoder, for example.

24 Claims, 12 Drawing Sheets

HDTV CHIP WITH A SINGLE IF STRIP FOR HANDLING ANALOG AND DIGITAL RECEPTION

CROSS-REFERENCE TO RELATED APPLICATIONS/INCORPORATION BY REFERENCE

This application is a Continuation-In-Part of U.S. Non-Provisional Application entitled "Digital IF Demodulator With Carrier Recovery," Ser. No. 10/448,062, filed May 30, 2003, which is a Continuation-In-Part of U.S. Non-Provisional Application entitled "Digital IF Demodulator for Video Applications," Ser. No. 09/739,349, filed Dec. 15, 2000, and which also claims the benefit of U S. Provisional Patent Application 60/401,043, filed on Aug. 6, 2002.

This application also makes reference to:
U.S. application Ser. No. 10/774,037 filed Feb. 6, 2004;
U.S. application Ser. No. 10/943,267 filed Sep. 17, 2004;
U.S. application Ser. No. 10/943,596 filed Sep. 17, 2004; and
U.S. application Ser. No. 11/137,528 filed May 25, 2005.

All of the above stated applications are hereby incorporated herein by reference in their entirety.

FIELD OF THE INVENTION

Certain embodiments of the invention relate to high definition television (HDTV). More specifically, certain embodiments of the invention relate to a method and system for a HDTV chip with a single intermediate frequency (IF) strip for handling analog and digital signals.

BACKGROUND OF THE INVENTION

Digital television, popularly referred to as DTV, is an enhanced television system capable of transmitting and receiving digitized signals, displaying digital images and playing digital audio. While some of these features may be present in current analog television systems such as national television standards committee (NTSC), sequential couleur avec memoire (SECAM) and phase alternate line (PAL), the combination of digitized transmission, reception, video and audio distinguishes digital television from current analog television systems.

Digital television employs various digital signal processing techniques and utilizes scarce bandwidth in a more spectrally efficient manner to transport and present audio and video signals in a way that is superior to current analog television systems. In this regard, digital television allows more channels containing more information to be broadcasted within an equivalent bandwidth utilized by current analog television systems. Accordingly, any excess bandwidth can be re-allocated for use by other types of communication systems. Broadcasters utilizing digital television systems are therefore, capable of providing over-the air television signals containing higher picture resolutions than current analog broadcast television systems Broadcasters utilizing digital television systems may also have the capability to provide multicasting and datacasting services using the same bandwidth allocated for conventional analog television systems. For these reasons, Congress mandated that current broadcast television service must, in time, be completely converted to digital television. While digital television (DTV) utilizes the same broadcast very high frequency (VHF) spectral band and ultra-high frequency spectral (UHF) band as conventional television broadcasting systems, digital television utilizes different modulation techniques than conventional analog television broadcasting systems. Conventional analog television broadcasting systems modulate video using amplitude modulation (AM) and the accompanying audio is modulated using frequency modulation (FM). DTV utilizes a plurality of modulation techniques for transmitting and receiving packetized digital signals. In the United States of America, an eight level vestigial sideband (VSB) modulation scheme is utilized. In some regions of Europe and Asia, for example, coded orthogonal frequency division multiplexing is the modulation scheme of choice. On the other hand, digital satellite systems (DSS) utilize quadrature phase shift keying, while cable television (CATV) system utilizes quadrature amplitude modulation (QAM).

In the United States, a plurality of broadcast formats promulgated by the Advanced Television Standards Committee (ATSC) has been adopted for DTV applications. Some of these formats comprise progressive-scan video comprising 480 scan lines referred to as 480p, interlaced 4:3 video having 480 scan lines referred to as 480i, interlaced video having 1080 scan lines referred to as 1080i and progressive-scan video having 720 scan lines referred to as 720p. Standard definition (SD) television (SDTV) utilizes the interlaced 480i and progressive 480p formats. The picture quality provided by SDTV is comparable in certain respects to conventional NTSC 525 lines systems. High definition (HD) television (HDTV) utilizes the interlaced 1080i and progressive 720p formats in a 16:9 aspect ratio. The resolution of the HDTV interlaced 1080i and progressive 720p formats may be converted to lower resolution such as the interlaced 480i and progressive 480p formats provided by SDTV.

In the US for example, DTV signals are modulated on an RF carrier using 8-level VSB or 8 VSB, and transmitted in a six (6) MHz channel as compressed 4:2:0 MPEG-2 formatted packetized streams. These packetized streams contain both audio and video information. For this reason, a conventional analog system is unable to receive a transmitted DTV signal. In order to decode a received 8-level VSB signal, an ATSC-compliant DTV receiver or a set-top box is required.

In some conventional HDTV application, different integrated circuits are coupled to provide various analog and digital services. These non-integrated solutions are cost prohibitive, especially for low to mid range television (TV) manufacturers. Existing integrated TV-on-a-chip solutions do not support analog video input, and lacks support for HDMI, and POD/CableCard. In addition, existing integrated TV-on-a-chip solutions do not have 3D and 2D comb filters and motion adaptive deinterlacer functionalities. Furthermore, existing integrated TV-on-a-chip solutions receive analog and digital video signals via separate paths, thereby increasing the silicon surface and cost of implementation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a HDTV chip with a single intermediate frequency (IF) strip for handling analog and digital signals, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a high definition television (HDTV) chip with a single intermediate frequency (IF) strip for handling analog and digital signals. The single integrated HDTV chip for analog and digital reception may support digital and dual analog signal processing of video signals acquired via an IF input, a high definition multimedia interface (HDMI)/digital video interface (DVI) input, an analog baseband input (component HD video, composite video, S-video), ITU656 input, and/or a HD-DVI input. The IF input may comprise a vestigial sideband (VSB) input, a quadrature amplitude modulation (QAM) input, and an NTSC input. In this regard, the single integrated high definition television chip for analog and digital reception may provide picture-in-picture functionalities, 3D and 2D comb filtering and motion adaptive deinterlacer functionalities without the need for off-chip processing. Furthermore, the single integrated high definition television chip for analog and digital reception may be adapted to receive analog and digital signals via a single communication path. In this regard, the single integrated high definition television chip for analog and digital reception may utilize a single intermediate frequency (IF) strip for communicating analog and/or digital signals for processing, thereby increasing processing speed and decreasing implementation costs.

Figure 1:
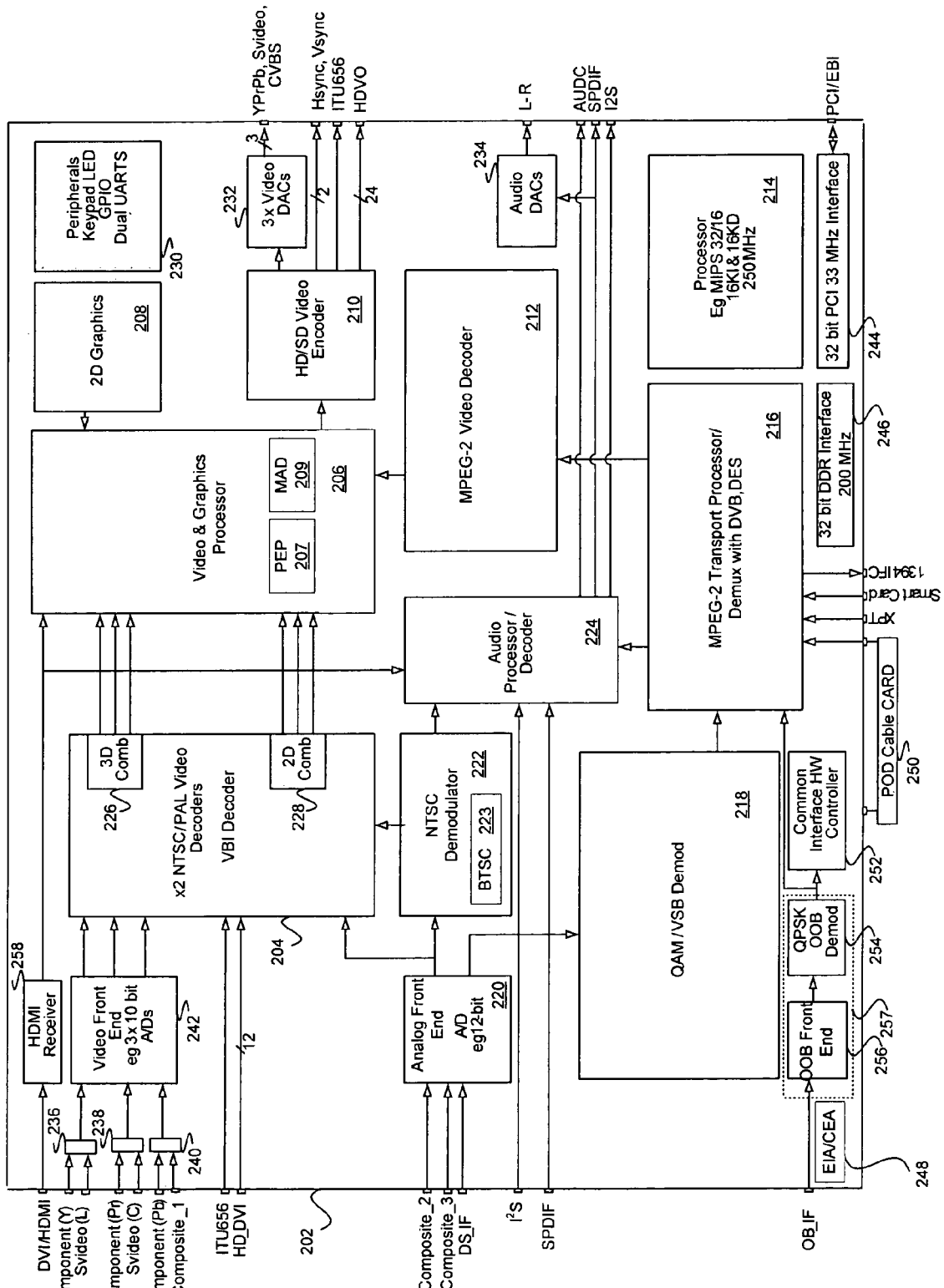
FIG. 1 is a block diagram of an exemplary system for single integrated high definition television chip for analog and digital reception, in accordance with an embodiment of the invention.

FIG. 1 is a block diagram of an exemplary system for single integrated high definition television chip for analog and digital reception, in accordance with an embodiment of the invention. Referring to FIG. 1, the single integrated HDTV chip for analog and digital reception 202 may comprise an HDMI receiver 258, multiplexers 236, . . . , 240, a video front end 242, a dual video decoder 204, a video and graphics processor 206, 2D graphics generator 208, peripheral inputs 230, HD/SD video encoder 210, video digital-to-analog converters (DACs) 232, and an in-band analog front end 220. The single integrated HDTV chip for analog and digital reception 202 may also comprise an NTSC demodulator 222, audio processor 224, MPEG-2 video decoder 212, audio DACs 234, QAM/VSB demodulator 218, MPEG-2 demultiplexer 216, MIPS processor 214, OOB receiver block 257, common interface hardware controller 252, EIA/CEA 909 smart antenna interface 248, POD/CableCard interface 250, DDR interface 246, and a PCI interface 244.

The multiplexers 236, . . . , 240 may each be adapted to select an analog signal and communicate the selected signal to the video front end block 242 for processing. The single integrated HDTV chip for analog and digital reception 202 may support digital and dual analog signal processing of video signals acquired via an IF input (VSB, QAM, NTSC), an HDMI/DVI input, an analog baseband input (component HD video, composite video, S-video), ITU656 input, and/or a HD-DVI input. Component (Y) signals and S-video (L) signals may be multiplexed by the multiplexer 236. Component (Pr) signals and S-video (C) signals may be multiplexed by the multiplexer 238. Similarly, component (Pb) signals and a first composite signal may be multiplexed by the multiplexer 240.

The video front end block 242 may comprise suitable circuitry and/or logic and may be adapted to convert the analog signal communicated from one or more of the multiplexers 236, . . . , 240 to a digital format. The converted digital signal may then be communicated to the dual video decoder 204 for processing. In one aspect of the invention, the video front end block may comprise three 10-bit A/D converters for converting analog signals received from the multiplexers 236, . . . , 240.

The dual video decoder 204 may comprise suitable circuitry and/or logic and may be adapted to decode a dual analog signal for PIP functionality. The dual video decoder 204 may decode component, S-video, and/or composite video signals received from the video front end block 242. NTSC/PAL composite video signal may be decoded into digital component video signals. The dual video decoder 204 may be adapted to accept composite (480i), S-video (480i), and component HD input (480i, 480p, 720p, 1080i). In one aspect of the invention, the dual video decoder 204 may comprise a primary and a secondary decoder, for example. The primary decoder may be supported by a vertical blanking interval (VBI) decoder for Teletext, North American basic teletext standard (NABTS), Close Caption, copy generation management system for analog (CGMS-A) and/or wide screen switching (WSS).

Teletext information may be generated, for example, by a data communications information service used to transmit information from remote data banks to viewers. The secondary decoder may be adapted to accept composite (480i) input and may be utilized for analog PIP mode. In this regard, the dual video decoder may comprise a 3D comb filter 226 and a 2D comb filter 228 for filtering composite video signals. The 3D comb filter 226 may be utilized to filter a composite video signal for a main video signal output and the 2D comb filter 228 may be adapted to filter a composite video signal for a PIP display signal. A more detailed description of a 3D comb filter, which may be representative of 3D comb filter 226, is disclosed in U.S. application Ser. No. 10/943,267, which is incorporated herein by reference in its entirety. A more detailed description of a 2D comb filter, which may be representative of 2D comb filter 228, is disclosed in U.S. application Ser. No. 10/943,596, which is incorporated herein by reference in its entirety.

In an exemplary aspect of the invention, the dual video decoder 204 may also be adapted to acquire ITU656 SD video signals and/or HD-DVI video signals for decoding. The HD-DVI input port, as well as the HD-DVO digital output port of the single integrated HDTV chip for analog and digital reception 202, may supports SD, HD and/or VESA formats, 12-bit and 24-bit data formats, and 4:4:4 RGB, 4:4:4 YCrCb, and 4:2:2 YCrCb pixel formats.

Decoded video signals may be communicated from the dual video decoder 204 to the video and graphics processor 206 for further processing. The video and graphics processor 206 may comprise suitable circuitry and/or logic and may be adapted to scale, deinterlace and/or further enhance the decoded video signals received from the dual video decoder 204. For example, the video and graphics processor 204 may comprise a scaler with a scaling range from 1/32 (down scaling) to 32 (upscaling). Horizontal scaling modes may comprise two half-band filter stages and one final 8-tap polyphase filter, for example. Vertical scaling modes may comprise 2-tap FIR, 4-tap FIR, and block averaging. Non-linear scaling may-also be utilized with a full screen display of a 4:3 video on a 16:9 television.

In another aspect of the invention, the graphics processor 206 may comprise a motion adaptive de-interlacing (MAD) block 209 and a picture enhancement processor (PEP) 207. The MAD block may utilize reverse 3:2 and 2:2 pulldown and may accept 480i and generated 480p video signals. In addition, the MAD block may utilize five fields of video to determine motion and may provide cross-chrominance removal. The PEP 207 may utilize user-controlled color space and brightness to improve image quality. The PEP 207 may be adapted to provide color adjustment, luma adjustment, color clip protection for illegal pixel values, and letterbox and center cut detection. Chroma and luma adjustments may be achieved by the PEP 207 utilizing, for example, a look-up table (LUT) for maximum flexibility.

The 2D graphics generator 208 may comprise suitable circuitry and/or logic and may be adapted to generate graphics, such as menus, for rendering the generated graphics on top of the video signals processed by the video and graphics processor 206. The 2D graphics generator 208 may also be adapted to acquire input from the peripheral input block 230 and render 2D graphics based on the acquired input. The peripheral input block 230 may acquire inputs from a keypad; IR receiver, IR Blaster, UARTs, PWM, SmartCard interface, an I²C master interface, an SPI master interface, and general purpose input/output interface, for example.

The HD/SD video encoder 210 may comprise suitable circuitry, logic and/or code and may be adapted to acquire a processed video signal from the video and graphics processor 206 and encode the signal into NTSC, PAL, component (480i, 480p, 720p, 1080i), S-video, and/or composite formats. In addition, the HD/SD video encoder 210 may support digital standards, such ITU-R 656 and DVI signal encoding. VBI-encoded data may be combined with appropriate lines of video prior to generating the encoded output signal. In an exemplary aspect of the invention, the HD/SD encoder 210 may communicate digitized encoded signal to the video DACs block 232. The video DACs block 232 may then generate composite, component, and/or S-video signal outputs.

The audio processor 224 may comprise suitable circuitry, logic and/or code and may be adapted to decode audio signals acquired via the I²S interface and/or via the SPDIF interface of the single integrated HDTV chip for analog and digital reception 202. The single integrated HDTV chip for analog and digital reception 202 may be adapted to acquire audio signals via an I²S interface and/or via an SPDIF interface. The acquired audio signals may be communicated to the audio processor 224 for decoding. The audio processor 224 may be adapted to process Dolby digital and MPEG layer 1,2 signals. In addition, the audio processor 224 may support SPDIF pass-through of digital theatre systems (DTS) and advanced audio coding (MC) audio streams, packetized elementary stream (PES) or elementary stream (ES) output of MPEG MC.

The audio processor 224 may also support MPEG Layer 1, 2, and 3, DTS, and Dolby digital for interface to an external decoder, compressed MC, MPEG Layer 1, 2, and 3, DTS, and Dolby digital on an I²S output, and decoding compressed audio signals from system DRAM, for example. The audio processor 224 may support Dolby 5.1-channel audio coding for data rates 32, 40, 48, 56, 64, 80, 96, 112, 128, 160, 192, 224, 256, 320,384, 448, 512, 576, 640 kbps, for example. In addition, the audio processor 224 may support MPEG Layer 1 audio coding for data rates 32, 64, 96, 128, 160, 192, 224, 256, 288, 320, 352, 384, 416, 448 kbps, for example. The audio processor 224 may also provide support for MPEG Layer 2 audio coding for data rates 32, 48, 56, 64, 80, 96, 112, 128, 160, 192, 224, 256, 320, 384 kbps, for example.

Decoded digital audio signals may be communicated from the audio processor 224 to the audio DACs 234 and/or to audio signal outputs of the single integrated HDTV chip for analog and digital reception 202. Decoded audio signals may be communicated by the audio processor 224 as audio signal outputs utilizing an SPDIF output interface, an I²S output interface, and/or a compressed audio output interface. The audio DACs 234 may be adapted to generate stereo digital audio outputs.

The HDMI receiver 258 may comprise suitable circuitry and/or code and may be adapted to support standard, enhanced, or high-definition video, as well as multi-channel digital audio on a single cable. The HDMI receiver 258 may also be adapted to process signals in any ATSC HDTV standard, as well as 8-channel digital audio signals. Decoded audio and video signals may be communicated by the HDMI receiver 258 to the audio decoder 224 and the video and graphics processor 206, respectively, for further processing. In an exemplary embodiment of the invention, the single integrated HDTV chip for analog and digital reception 202 may utilize a high-definition multimedia interface (HDMI) receiver 258 to receive and process HDMI signals via a DVI-HDMI port. HDMI may provide a secure interface between an audio/video source, such as a set-top box, DVD player, and audio/video receiver and an audio and/or video monitor, such as a digital television (DTV).

Figure 2:
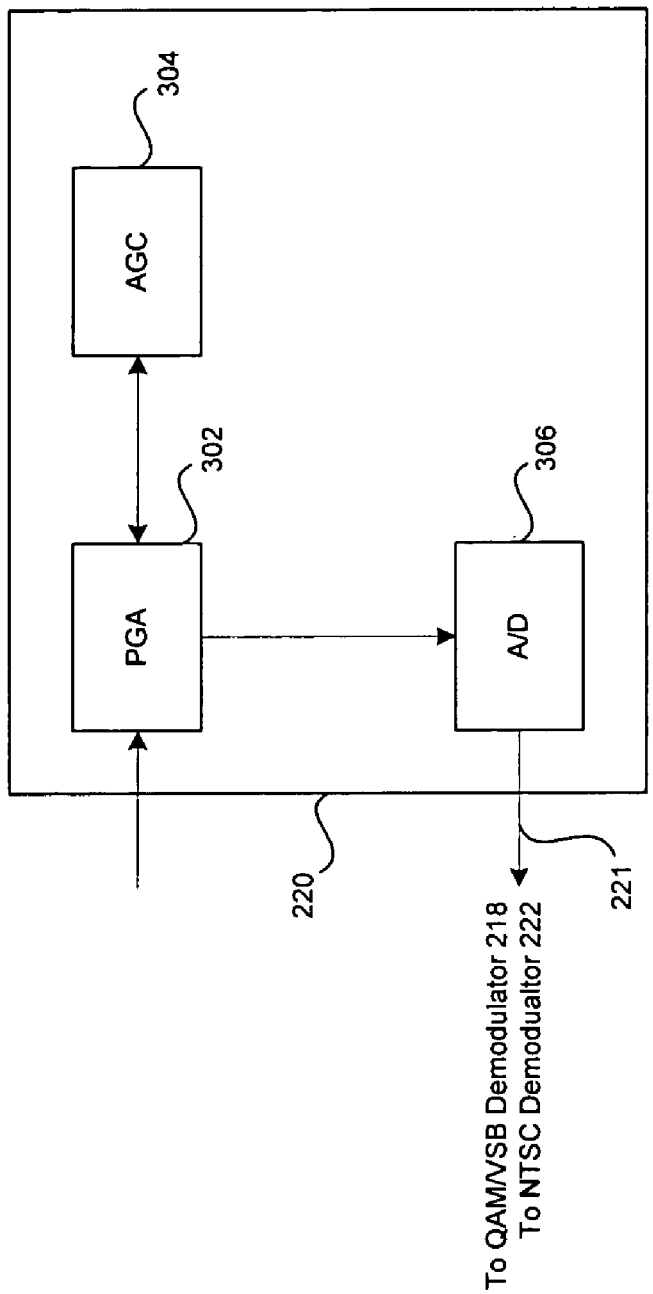
FIG. 2 is a block diagram of the inband analog front end block 220 of FIG. 2, in accordance with an embodiment of the invention.

FIG. 2 is a block diagram of the inband analog front end block 220 of FIG. 2, in accordance with an embodiment of the invention. Referring to FIG. 2, the inband analog front end block 220 may comprise a programmable gain amplifier (PGA) block 302, an automatic gain control block (AGC) 304 and an analog-to-digital (A/D) converter 306.

The automatic gain control block 304 may comprise a digital AGC circuit which may be adapted to control or adjust various power levels seen by the VSB/QAM demodulator 218 and the NTSC demodulator 222, all shown in FIG. 2. Adjustment of these voltage levels may be utilized to remove or otherwise mitigate the effects of any amplitude variation in the signals entering the single chip integrated DTV receiver. An optimal loading of the A/D converters in the inband analog front end block 220 may be provided by adjusting these voltage levels.

The inband analog front end block 220 may be configured to receive analog signals at the common IF center frequencies. The internal programmable gain amplifier 302 may comprise suitable logic, circuitry, and/or code that may be adapted to adjust a gain of incoming signal. The automatic gain control block 304 may utilize closed loop automatic gain control. In accordance with an embodiment of the invention the A/D converter 306 in the inband analog front end block 220 may comprise a 12-bit A/D converter, for example. Composite baseband signals may be communicated from the inband analog front end block 220 to the dual video decoder 204 for processing. NTSC and BTSC signals may be communicated to the NTSC demodulator 222. Similarly, digital content signals may be communicated to the QAM/VSB demodulator 218.

Figure 3:
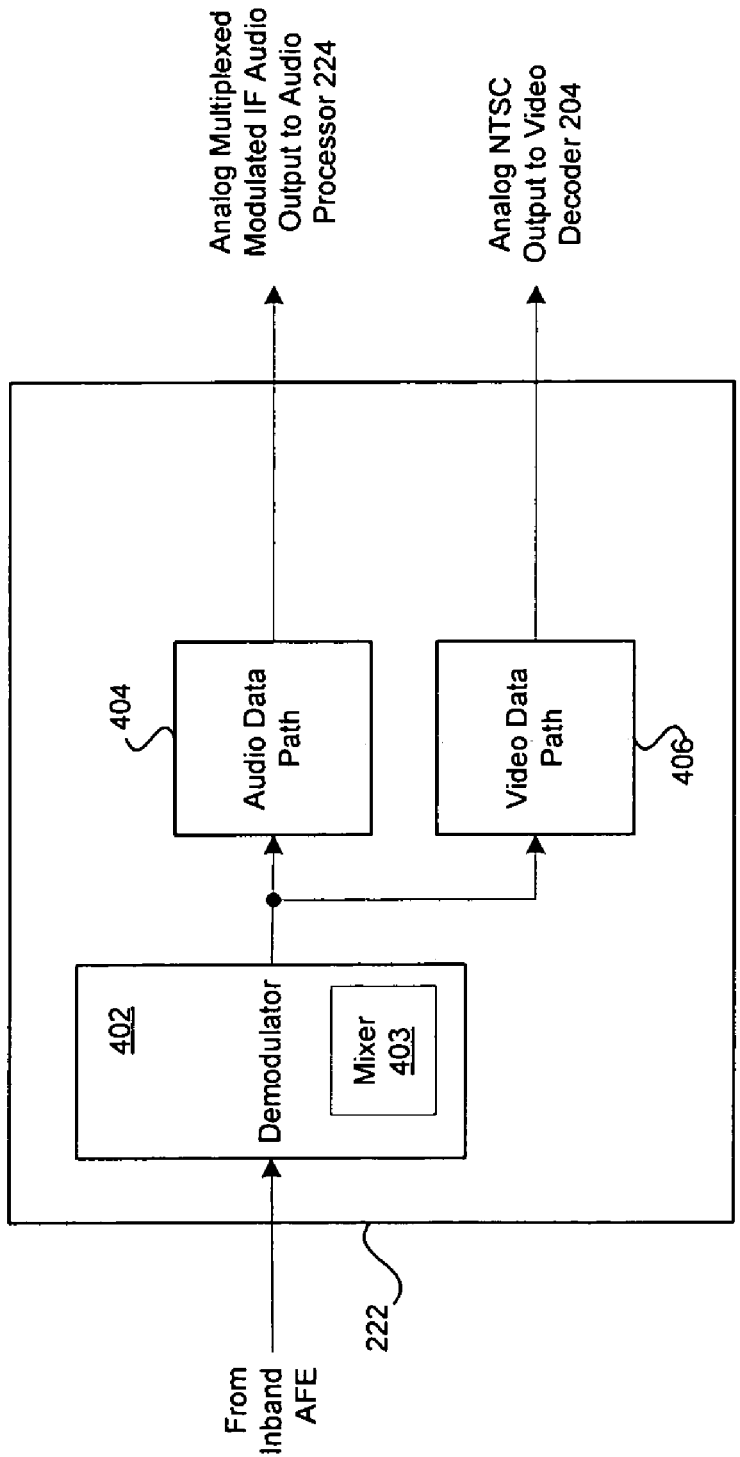
FIG. 3 is a functional block diagram of the NTSC demodulator block 222 of FIG. 2, in accordance with an embodiment of the invention.
Figure 4:
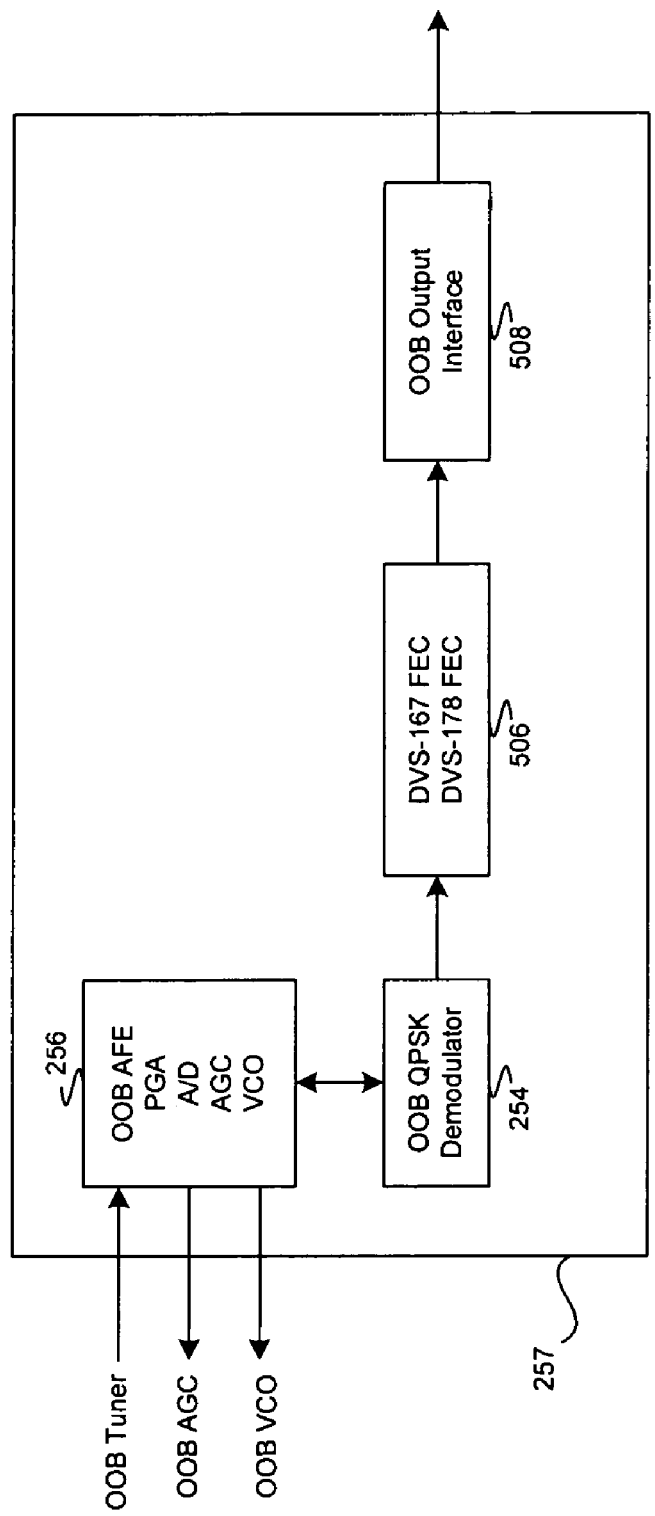
FIG. 4 is a block diagram illustrating the out-of-band (OOB) receiver block 257 of FIG. 2, in accordance with an embodiment of the invention.

FIG. 3 is a functional block diagram of the NTSC demodulator block 222 of FIG. 2, in accordance with an embodiment of the invention. Referring to FIG. 4, the NTSC demodulator block 222 may comprise a demodulator block 402, an audio data path block 404, and a video data path block 406. The output of the audio data path block 404 may comprise an analog multiplexed modulated IF audio output and the output of the video data path block 406 may comprise an NTSC output, for example. The demodulator block 402 may be adapted to receive an output signal from the inband analog front end 220, for example, which may be tranferred to a digital mixer 403 in the demodulator block 402. The digital mixer 403 may convert the IF data in the output signal from the inband analog front end 220 to a complex baseband data stream. A pilot recovery loop may be utilized to control operation of the digital mixer 403. The output of the digital mixer 403 may be filtered and tranferred to the audio data path block 404.

The audio data path block 404 may comprise a complex mixer, a filter-and-decimate stage, and a frequency demodulation stage. The complex mixer may translate a FM audio carrier, for example, a 4.5 MHz NTSC carrier, to a baseband signal. The filter-and-decimate stage may be adapted to remove the video from the signal and reduce its sampling rate. The resulting decimated signal may be frequency demodulated to produce a monaural, or a baseband BTSC multiplexed signal.

The video data path block 406 may comprise a Nyquist filter, a group delay filter, an audio trap filter, and a gain/DC-level compensation block. The Nyquist filter may be configured to perform Nyquist shaping, which is traditionally done by a SAW filter at IF. The group-delay filter may provide group delay compensation within a specified FCC mask. The audio trap filter may be adapted to remove the audio signal from the video signal. Different audio trap filters may be implemented for different audio carrier locations. The gain/DC-level compensation block may acquire AGC and DC-level information from a video decoder and adjust the signal accordingly so as to attain a proper signal loading and DC-level for a composite video broadcasting signal (CVBS). The output of the video data path 406 may be routed through the dual video decoder 204 (FIG. 2) in the single integrated HDTV chip for analog and digital reception 202. The multiplexed modulated IF audio output from the audio data path 404 communicated to the audio processor 224 for further processing.

The NTSC demodulator block 222 may comprise a BTSC decoder 223 which may be adapted to receive input United States Broadcast Television Systems Committee (BTSC) compliant baseband multiplexed TV audio signals from an NTSC IF demodulator block within the NTSC demodulator 222. The BTSC decoder 223 may be adapted to operate, for example, in a single channel mode supporting a plurality of output rates such as 32 KHz, 44.1 KHz, and 48 KHz $I^2S$ outputs. The BTSC decoder 223 within the NTSC demodulator block 222 may also be adapted to produce stereo output, single or dual monaural output, or an independent separate audio programming (SAP) output.

In another aspect of the invention, the BTSC decoder 223 may be adapted to function as a digital multi-channel television sound decoder. A baseband analog BTSC composite signal extracted by the NTSC IF demodulator within the NTSC demodulator block 222 may be received by the BTSC decoder and processed fully in digital logic to recover the main left and right channels (L+R), stereo (L/R) channel, or SAP channels. The stereo decoding may include sum (L+R) channel, difference (L−R) channel decoding and rematrixing of sum and difference channel to retrieve left (L) and right (R) channel. The main channel (sum or mono channel) decoding may be processed as a subset of the stereo decoding. The difference channel decoding may comprise pilot tone recovery by using, for example, a phase locked loop (PLL), double side band (DSB) demodulation, and low pass filtering of the decoded difference signal. A variable de-emphasis circuit may provide DBX-TV compliant noise reduction. The sum channel decoding may comprise low pass filtering and de-emphasis. A second audio programming (SAP) decoding function may comprise FM demodulation and DBX variable de-emphasis and an integrated power detector may be utilized for pilot tone and SAP FM carrier. The BTSC decoder may automatically switch between stereo and monaural modes based on a pilot tone power or SAP decoding. Muting may be achieved based on a power associated with the SAP FM carrier.

The decoded PCM output from the BTSC decoder block within the NTSC demodulator block 222 may be programmed to sampling rates of, for example, 32 KHz, 44.1 KHz, and 48 KHz. These data rates may be supported by the on-chip audio DACs 234. Additionally, the left/right channel PCM may be output digitally through either the $I^2S$ bus or the on-chip Audio DACs 234.

The ATSC A/53 Digital Television Standard was developed by the Digital HDTV Grand Alliance of vendors and is the accepted standard for the terrestrial transmission of SDTV and HDTV signals in the United States. The ATSC A/53 Digital Television Standard is based on an 8-level vestigial sideband (8-VSB) trellis coded modulation format with a nominal payload data rate of about 19.4 Mbps in a 6 MHz channel. A high data rate, adopted for use in a cable television environment, is also specified by the standard. The ATSC A/53 Digital Television Standard may utilizes 16-VSB to provide a payload data rate of 38.8 Mbps in a 6 MHz channel. This mode is also compliant with Annex D of the ITU-T J.83 specifications. The QAM/VSB demodulator 218 in the single integrated HDTV chip for analog and digital reception 202 is compliant with the ATSC A/53 Digital Television Standard's normal mode and high data rate mode.

The QAM/VSB demodulator 218 may comprise suitable circuitry and/or logic and may be adapted to demodulate digital signals acquired from the inband analog front end block 220. The QAM/VSB demodulator 218 may operate in any of a plurality of standardized modes such as the CATV ITU-T J.83 Annex A/C mode. The ITU-T J.83 Annex A/C standard is utilized primarily outside the United States for digital cable television applications. In Europe, the ITU-T J.83 Annex A/C standard is known as the Digital Video Broadcast for Cable (DVB-C) standard. The Digital Audio-Visual Council (DAVIC) has adopted the DVB-C standard along with various extensions to support 256-QAM. The IEEE 802.14 committee has adopted Annex A/C as one of two possible physical layer standards for cable modems. Notwithstanding, the QAM/VSB demodulator 218 may provide support for the full standard, including up to 8 MHz channelization, as described in ITU-T J.83 Annex A and C, as well as all DAVIC extensions.

The QAM/VSB demodulator 218 may also be adapted to operate in a ITU-T J.83 Annex B mode, and may provide support for ITU-T J.83 Annex B standard, which is currently the dominant standard for digital television delivery over CATV networks in the United States. ITU-T J.83 Annex B has been adopted as the physical layer standard by various organizations such as the Society of Cable Telecommunications Engineers (SCTE DVS-031), the Multimedia Cable Network Systems (MCNS-DOCSIS), and the IEEE 802.14 Committee.

Demodulated digital signals may be communicated from the QAM/VSB demodulator 218 to the MPEG-2 demultiplexer 216 for demultiplexing. The MPEG-2 demultiplexer 216 may comprise DES/DVB descrambler for up to 32 PIDs utilizing 64-bit and 56-bit DES keys, for example. The MPEG-2 demultiplexer 216 may be adapted to parse a plurality of independent transport streams. In one embodiment of the invention, the MPEG-2 demultiplexer 216 may be adapted to parse five independent transport streams. In addition, the MPEG-2 demultiplexer 216 may utilize PES packet extraction for up to 32 PID channels and may support 32 section filters. The MPEG-2 demultiplexer 216 may also be adapted to acquire MPEG stream from an external port, a SmartCard port, and/or from an IEEE 1394 port. A POD/ CableCard port 250 may also be utilized to supply data to the MPEG-2 demultiplexer 216.

The demultiplexed MPEG video stream may be communicated to the MPEG-2 video decoder 212 for decoding. The MPEG-2 video decoder 212 may comprise an MPEG-V processor, a motion compute engine, a Huff-man decoder, inverse quantizer, an inverse discrete cosine transformer (IDCT) module, and a pixel reconstructor. The MPEG-2 video decoder 212 may be adapted to decode an HD MP@HL video stream and generate a standard definition (SD) output with reduced memory requirement. The decoded MPEG video stream may then be communicated to the video and graphics processor 206 for further processing. The demultiplexed audio stream may be communicated from the MPEG-2 demultiplexer 216 to the audio processor 224 for processing.

The OOB receiver block 257 may comprise an QOB analog front end block 256 and a QPSK OOB demodulator block 254. The OOB receiver block 257 may be adapted to process OOB IF signals within the single integrated HDTV chip for analog and digital reception 202. FIG. 4 is a block diagram illustrating the out-of-band (OOB) receiver block 257 of FIG. 2, in accordance with an embodiment of the invention. Referring to FIG. 4, the out-of-band receiver block 257 may comprise an out-of-band (OOB) analog front end (AFE) 256, an out-of-band (OOB) QPSK demodulator 254, a DVS-167 FEC/DVS-178 FEC block 506, and and out-of-band output interface block 508. The OOB AFE block 256 may comprise a programmable gain amplifier, an A/D converter, an automatic gain control (AGC), and a voltage controlled oscilator (VCO).

The OOB receiver block 257 integrated within the single integrated HDTV chip for analog and digital reception 202 may be utilized with an an IF centered signal. The OOB AFE block 256 integrated within the OOB receiver block 257 may utilize a frequency agile local oscillator (LO) that may be adapted to downconvert any channel in, for example, the 70-150 MHz frequency range to a SAW centered IF. The desired channel may then be sub-sampled by an A/D converter.

The OOB QPSK demodulator block 254 may be adapted to receive an IF sampled input from the A/D converter and may downconvert the sampled input to baseband with a full quadrature mixer driven by a carrier recovery loop, for example. The resulting true-baseband data stream may be resampled under control of a clock recovery loop to produce a data stream that is correctly sampled in both frequency and phase. The I and Q baseband signal components may then be filtered by dual square-root Nyquist filters.

The OOB receiver block 257 may also comprise, for example, two automatic gain control loops (AGC). The first loop may be closed locally at the programmable gain amplifier and may be referred to as the inner IF loop, or the AGC loop. The second loop may be closed at the tuner and may be referred to as the outer tuner loop, or the delayed-AGC loop. Accordingly, gain control may be divided between the inner and outer tuner loops. Each loop may comprise a power estimate, a threshold comparison, and a first order loop filter. The filter output may be utilized to directly control the PGA gain in the case of the inner loop and may be fed into a sigma-delta modulator to generate an analog control voltage in the case of the outer loop.

A baud recovery loop comprising a timing error discriminant, a loop filter and a digital timing recovery block may be utilized to control a digital resampler. The timing error discriminant may be adapted to output a new value for each baud that is filtered by a digital integral-plus-proportional lowpass filter, which features programmable coefficients. The loop integrator may be read in order to provide loop monitoring or written for direct control by the acquisition processor block 240. Data from the loop filter may be applied to a digitally controlled frequency synthesizer that may permit the baud rate to be varied over.

The OOB receiver block 257 may also comprise OOB carrier frequency/phase recovery and tracking loops, which may be all-digital loops that are configured to simultaneously offer a wide acquisition range and a large phase noise tracking capability. The OOB carrier frequency/phase recovery and tracking loops may be adapted to estimate the angle and/or direction for frequency/phase compensation. An integral plus-proportional filter may be utilized to filter the out-of-band carrier frequency/phase recovery and tracking loops. The bandwidth of the loop may be adjusted by programming the integrator and linear coefficients of the integral plus-proportional filter. An output of the loop filter may be utilized to control, for example, a derotator. The integrator may be read to provide loop monitoring and/or directly written to provide control by an acquisition processor.

The OOB QPSK demodulator block 254 may comprise a decision feedback equalizer (DFE) with feed-forward taps and feedback taps, which may be adapted to remove or otherwise mitigate the effects of ISI generated by worst-case coaxial cable channels including a wide variety of impairments such as un-terminated stubs. The equalizer coefficients may be updated at, for example, every baud cycle to provide fast convergence.

The DVS-167 (DAVIC) FEC/DVS-178 (DIGICIPHERII) FEC block 506, which may also be referred to as an out-of-band FEC block 506, may comprise a frame synchronization function, a deinterleaving function, a Reed-Solomon (RS) decoding function, and a derandomization function, for example. At least some of these functions may be programmable so that the out-of-band FEC block 506 may be adapted to handle both the DigiCipher II and DAVIC out-of-band FEC specifications. The OOB output interface 508 may be utilized to communicate OOB output signals from the OOB receiver 257 to the common interface hardware, controller 252 and/or to the MPEG-2 demultiplexer 216.

The MIPS processor 214 may utilize caches with bridging to memory and a local bus, where external peripherals may be attached. Integrated peripherals may be accessed through the peripherals block 230 and may comprise UARTS, counter/timers, GPIO, keypad, LED, IR Tx/Rx, IR Keyboard, BSC (I2C) and SPI controllers, for example. The MIPS processor 214 may comprise 16 k 2-way I-cache, 16 KB 2 way D-cache, and a memory management unit (MMU) with a table look-aside buffer (TLB), for example. Further, 16-bit instruction support and EJTAG support may also be provided by the MIPS processor 214.

The PCI interface 244 may comprise a 32-bit PCI 33 MHz interface may be PCI revision 2.3 compliant and may provide PCI host and client modes, PCI master and target modes, 2 DMA engines (TX and RX), full bandwidth burst at 32 bytes/transfer; and 2 mailbox and 2 doorbell registers for inter-processor communication.

The POD/CableCard interface 250 may comprise an Open Cable compliant CableCARD/POD direct interface with glue-less interface to a POD module. The single integrated HDTV chip for analog and digital reception 202 may utilize the DDR interface 246 to communicate with off-chip memory. The DDR interface 246 may comprise a 32-bit 200 MHz DDR-DRAM controller, for example.

Figure 5:
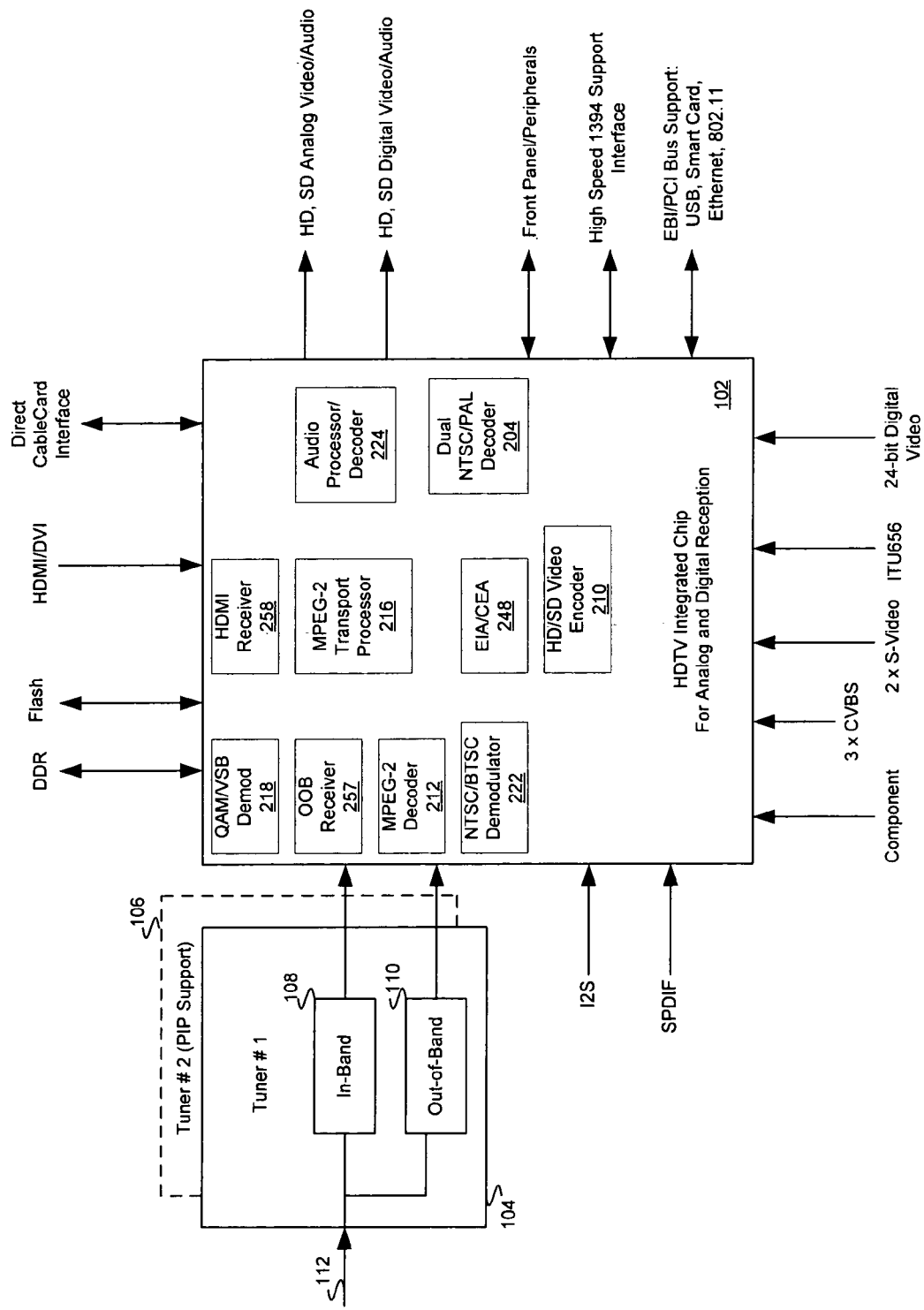
FIG. 5 is a functional block diagram of an exemplary system for single integrated high definition television chip for analog and digital reception, in accordance with an embodiment of the invention.

FIG. 5 is a functional block diagram of an exemplary system for single integrated high definition television chip for analog and digital reception, in accordance with an embodiment of the invention. Referring to FIG. 5, the single integrated HDTV chip for analog and digital reception 102 may comprise a QAM/VSB demodulator 218, an out-of-band (OOB) receiver 257, an NTSC demodulator 222, an HDMI receiver 258, an MPEG-2 transport processor/demultiplexer 216, an audio processor 224, a dual video decoder 204, an HD/SD video encoder 210, an MPEG-2 video decoder 212, and an EIA/CEA 909 smart antenna interface 248. Analog and/or digital signals may be acquired by the single integrated HDTV chip for analog and digital reception 102 via IF inputs, such as VSB, QAM, and NTSC, an HDMI/DVI input, a plurality of analog baseband inputs, an ITU656 input, and/or a HD-DVI input, for example. The HD-DVI video input may be adapted to supply digital video signals, such as 24-bit digital video. The analog baseband inputs may comprise component video inputs, composite video inputs, and/or S-video inputs.

The IF inputs may comprise in-band and/or out-of-band signals received from a first tuner 104 and/or a second tuner 106. The first tuner 104 and the second tuner 106 may comprise suitable circuitry and/or logic and may be adapted to receive an input signal 112, such as a cable or an Advanced Television Systems Committee (ATSC) signal. The first tuner 104 and the second tuner 106 may then generate corresponding IF in-band and out-of-band signals, which may be communicated to the single integrated HDTV chip for analog and digital reception 102. In this regard, the first tuner 104 and the second tuner 106 may comprise an in-band processing block 108 and an out-of-band processing block 110. The in-band IF signals may comprise VSB signals, QAM signals, and/or NTSC/PAL signals, for example. In an exemplary aspect of the invention, signal outputs from both tuners 104 and 106 may be communicated to the single integrated HDTV chip for analog and digital reception 102 for processing by a dual analog signal processor, for example. The dual analog signals may then be utilized for picture-in-picture (PIP) functionality.

The first NTSC/PAL analog video decoder within the dual NTSC/PAL decoder 136 may be supported by motion adaptive de-interlacing and a 3D comb filter. The second NTSC/PAL decoder within the dual NTSC/PAL decoder 136 may be utilized for analog picture-in-picture (PIP) functionality. In this -regard, the second NTSC/PAL decoder may support composite and/or S-video inputs. Advanced 2D graphics processing capability may be provided by an integrated processor, such as an advanced 2D Graphics Processor offered by Broadcom Corporation of Irvine, Calif.

The cable/terrestrial receiver may be adapted to directly sample a tuner output, such as an output from tuner 104 or tuner 106, with an A/D converter. The cable/terrestrial receiver may also digitally re-sample and demodulate the signal with recovered clock and carrier timing. Further, the cable/terrestrial receiver may filter and equalize the data and pass soft decisions to an ATSC A/53 and ITU-T J.83 Annex A/B/C compatible decoder. The HDTV chip for single integrated analog and digital reception 102 may also comprise a CEA/EIA-909 smart antenna interface 128, a high speed IEEE 1394 FireWire interface 130, and an EBI/PCI bus support 132 for USB, SmartCard, Ethernet, and/or 802.11 capabilities.

The OOB receiver 257 may be adapted to directly sample and digitize a surface acoustical wave (SAW) centered IF OOB signal, for example. The OOB receiver 257 may also demodulate the signal with recovered clock and carrier timing, filter and equalize the data, and incorporate a DigiCipher II/Digital Audio Video Council (DAVIC)-compatible forward error correction (FEC) decoder. A common hardware interface may be utilized to provide a direct interface to a POD/CableCard. OOB signals generated by the first tuner 104 or the second tuner 106 may be communicated to the OOB receiver 257 within the single integrated HDTV chip for analog and digital reception 102.

Audio signals may be communicated to the single integrated HDTV chip for analog and digital reception 102 via an $I^2S$ port or an SPDIF port, for example. The single integrated HDTV chip for analog and digital reception 102 may also utilize an off-chip DDR-SDRAM and/or a flash memory during signal processing. Peripheral inputs may be utilized to add 2D graphic support for the output video signal, for example. The single integrated HDTV chip for analog and digital reception 102 may generate as outputs HD or SD analog or digital video and audio signals.

Figure 6:
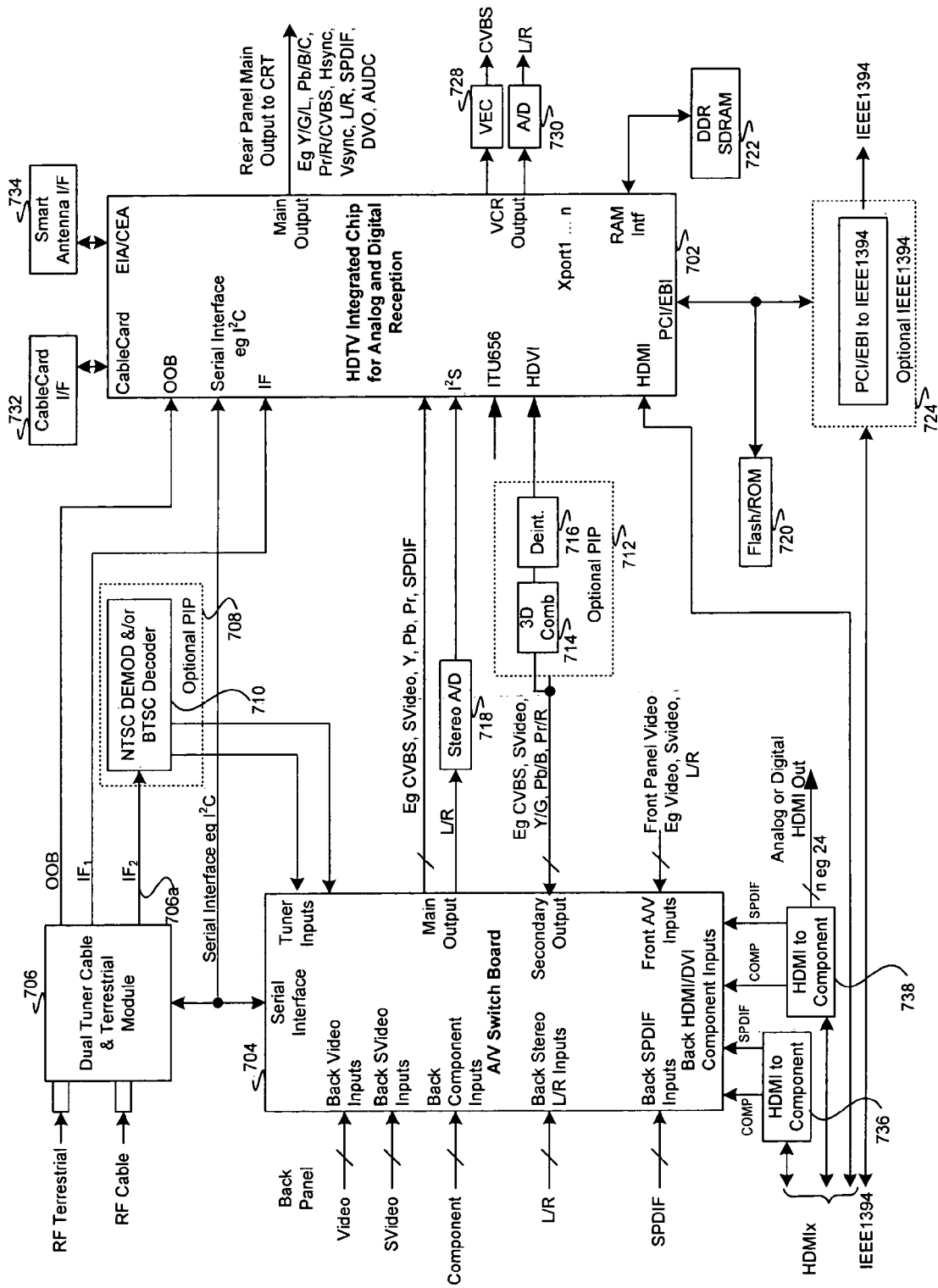
FIG. 6 is a block diagram of an exemplary system configuration of the single integrated high definition television chip for analog and digital reception illustrating various usage modes, in accordance with an embodiment of the invention.

FIG. 6 is a block diagram of an exemplary system configuration of the single integrated high definition television chip for analog and digital reception illustrating various usage modes, in accordance with an embodiment of the invention. Referring to FIG. 6, there is shown a single integrated HDTV chip for analog and digital reception 702, a CableCard interface 732, a smart antenna interface 734, a video encoder 728 an A/D converter 730, DDR SDRAM 722, an optional IEEE 1394 interface 724, a flash or ROM memory 720, an optional PIP block 712, a stereo A/D converter 718, an optional PIP 708, a dual tuner 706, HDMI/Component converters 736 and 738, and an audio/video (A/V) switch board 704.

In an exemplary aspect of the invention, the single integrated HDTV chip for analog and digital reception 702 may be adapted to support a plurality of display configurations utilizing video signals received from the dual tuner 706, the A/V switch board 704, the DDR SDRAM 722, the flash/ROM 720, and/or the optional PIP 712. For example, there may be a main display and a picture-in-picture (PIP) display supported by the single integrated HDTV chip for analog and digital reception 702. The main display may be HD or SD (480i, 480p, 720p, 1080i) compatible. The picture-in-picture (PIP) display may be a window within the main display. The two displays may be fed from a plurality of sources. These sources may comprise a digital MPEG Decoder (480i, 480p, 720p, 1080i), a digital HD_DVI (480i, 480p, 720p, 1089i and 60 Hz VESA modes), an analog base-band Video, CVBS (480i), S-Video(480i), Component (480i, 480p, 720p, 1080i), ITU656 digital video input (480i), HDMI Analog input (480i, 480p, 720p, 1080i)

The single integrated HDTV chip for analog and digital reception 702 may be adapted to receive MPEG data via a plurality of external transport stream inputs, namely xport1, xport2, for example. In one embodiment of the invention, the xport1 input may be adapted to be primarily dedicated to the POD module. The xport2 input may be adapted to receive MPEG or MPEGx transport data from an external source, as long as the SD/HD MPEG resources are not used by the other inputs.

The dual tuner 706 may be adapted to provide cable and/or terrestrial IF video signals to the single integrated HDTV chip for analog and digital reception 702, the A/V switch board 704, and/or to the optional PIP block 708. Analog and digital signals may be communicated to the single integrated HDTV chip for analog and digital reception 702 utilizing the IF strip IF1. The dual tuner 706 may utilize a single IF strip 706a to communicate analog and/or digital television signals to the optional PIP 708. The optional PIP 708 may comprise an NTSC demodulator and BTSC decoder block 710. Demodulated signals may be communicated from the optional PIP 708 to the A/V switch 704. The dual tuner 706 may also communicate OOB signals to an OOB port in the single integrated HDTV chip for analog and digital reception 702.

In an exemplary aspect of the invention, the A/V switch board 704 may acquire IF video signals, as well as HDMI, analog baseband, ITU656 and HD-DVI signals for communication to the single integrated HDTV chip for analog and digital reception 702. Component signals and SPDIF signals may be acquired from the HDMI/Component converters 736 and 738. The optional PIP 712 function may utilize a composite video signal communicated from the A/V switch board 704 to generate an optional PIP function for use by the single integrated HDTV chip for analog and digital reception 702 via an HDMI interface. The optional PIP function may comprise a 3D comb filter 714 and a deinterlacer block 716. An incoming composite video signal may be initially filtered by the 3D comb filter so that luma and chrominance components may be separated. The filtered composite signal may then be deinterlaced by the deinterlacer block 716. The deinterlaced signal may then be communicated to the single integrated HDTV chip for analog and digital reception 702 via the HDMI interface for use in a HD PIP, for example.

Figure 7:
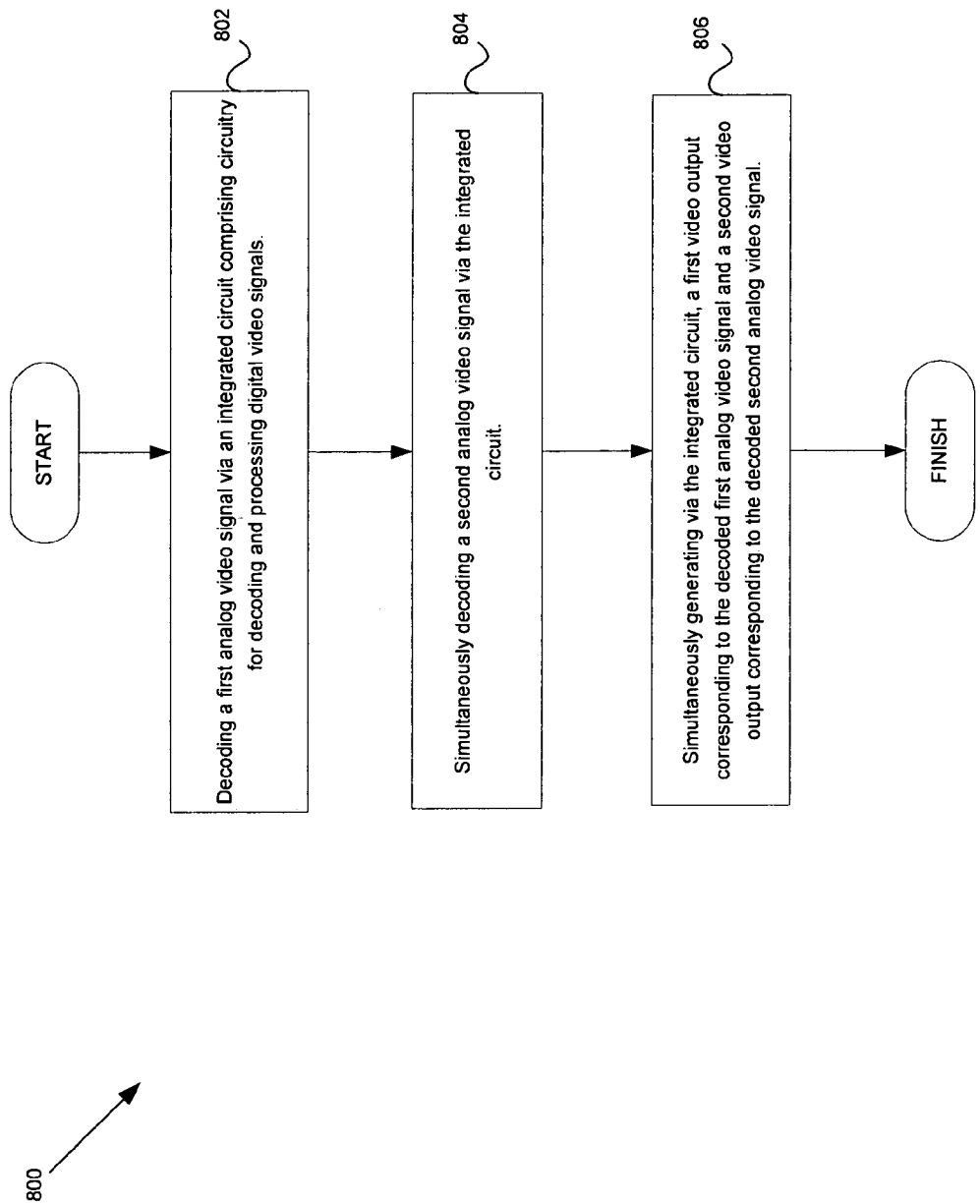
FIG. 7 is a flow chart illustrating exemplary steps that may be utilized for processing television signals, in accordance with an aspect of the invention.

FIG. 7 is a flow chart illustrating exemplary steps that may be utilized for processing television signals, in accordance with an aspect of the invention. Referring to FIG. 7, at 802, a first analog video signal may be decoded via an integrated circuit comprising circuitry for decoding and processing digital video signals. At 804, a second analog video signal may be simultaneously decoded via the integrated circuit. At 806, a first video output corresponding to the decoded first analog video signal and a second video output corresponding to the decoded second analog video signal may be simultaneously generated via the integrated circuit.

Figure 8A:
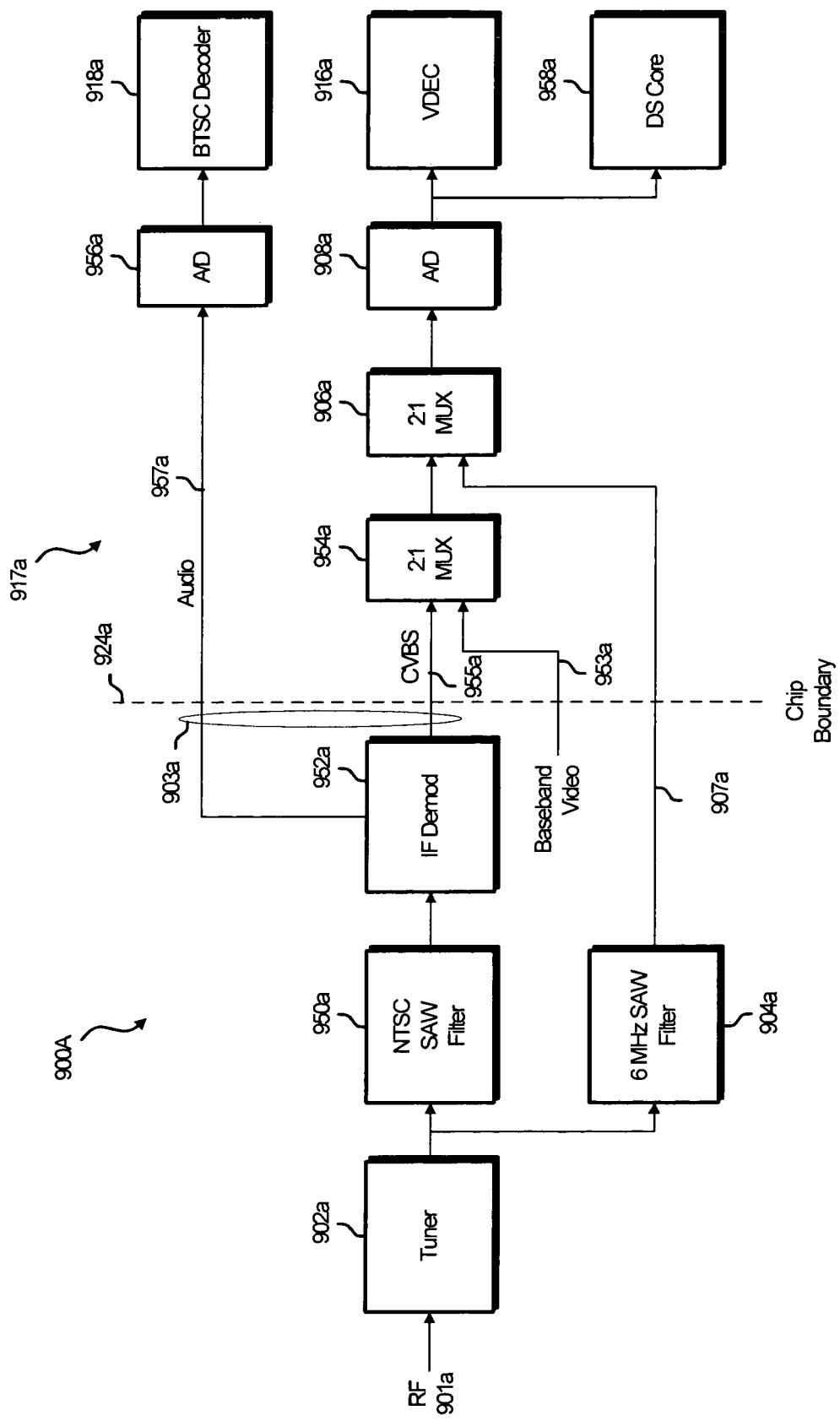
FIG. 8A illustrates an exemplary television receiver for processing analog and digital signals, which may be utilized in accordance with an embodiment of the invention.

FIG. 8A illustrates an exemplary television receiver for processing analog and digital signals, which may be utilized in accordance with an embodiment of the invention. Referring to FIG. 8A, the exemplary television receiver 900A may comprise an RF tuner 902a, a National Television Standards Committee (NTSC) (or Phase Alternation Line (PAL); or System Electronique Couleur Avec Memoir (SECAM)) surface acoustic wave (SAW) filter 950a, a SAW filter 904a, an analog IF demodulator 952a, and an IF processor 917a. The IF processor 917a may comprise analog-to-digital (A/D) converters 908a and 956a, a Broadcast Television Systems Committee (BTSC) decoder 918a, a video decoder (VDEC) 916a, a digital signal (DS) processing core 958, and multiplexers 954a and 906a. The IF processor 917a may be configured on a single semiconductor substrate, as indicated by the chip boundary line 924a.

The SAW filters 950a and 904a may comprise suitable circuitry, logic, and/or code and may be adapted to filter analog and/or digital signals received from the TV tuner 902a. For example, the SAW filter 950a may be adapted to filter analog video signals, such as NTSC video signals, and the SAW filter 904a may be adapted to filter digital signals. In one embodiment of the invention, the SAW filter 904a may be a 6 MHz SAW filter. Furthermore, even though the exemplary television receiver 900A utilizes two SAW filters, 950a and 904a, the present invention may not be so limited and a different number of filters may be utilized for processing analog and/or digital television signals.

The analog IF demodulator 952a may comprise suitable circuitry, logic, and/or code and may be adapted to demodulate the analog signal received from the NTSC SAW filter 950a and generate an analog audio signal 957a and an analog video signal 955a. The A/D converters 908a and 956a may comprise suitable circuitry, logic, and/or code and may be adapted to convert the analog video signal 955a and the analog audio signal 957a, respectively, to digital signals for further processing.

In operation, an RF signal 901a may be received by the tuner 902a, which may output analog and/or digital television signals to the SAW filters 950a and 904a. For example, analog television signals may be filtered by the NTSC SAW filter 950a and digital television signals may be filtered by the SAW filter 904a. The filtered analog signals may be communicated to the IF demodulator 952a for demodulating. The analog IF demodulator may demodulate the analog signal received from the SAW filter 950a and may generate analog audio signal 957a and analog video signal 955a. The analog audio signal may be converted to a digital signal by the A/D converter 956a. The digitized audio signals may then be decoded by the BTSC decoder 918a to generate an audio output signal.

The demodulated analog video signal 955a and the reference baseband video signal 953a may be multiplexed by the multiplexer 954a. The output of the multiplexer 954a may be multiplexed with the filtered digital signal 907a by the multiplexer 906a. In this regard, the multiplexer 906a may output demodulated analog video signal or a digital video signal.

The analog video and digital TV signals may be processed with the same A/D converter 908a. The digitized analog video signal may be decoded by the VDEC block 916a and the digital video signal may be decoded by the DS processing core 958a.

The television receiver 900A may utilize two separate processing paths for processing analog and digital signals. For example, an analog processing path for processing analog video signals may start from the output of the tuner 902a and may comprise the SAW filter 950a and the IF demodulator 952a. Similarly, a digital processing path for processing digital signals may also start from the output of the tuner 902a and may comprise the SAW filter 904a. In this regard, analog audio and video signals 903a may enter the on-chip boundary 924a via a separate path from the filtered digital signal 907a. In another embodiment of the invention, the television receiver may utilize a single processing path, or a single IF strip, for communicating analog and/or digital signals from the output of an RF tuner to an input of a television signal processing chip, such as a single integrated HDTV chip for analog and digital reception, for example. In this regard, a single IF strip may increase processing efficiency and decrease implementation costs.

Figure 8B:
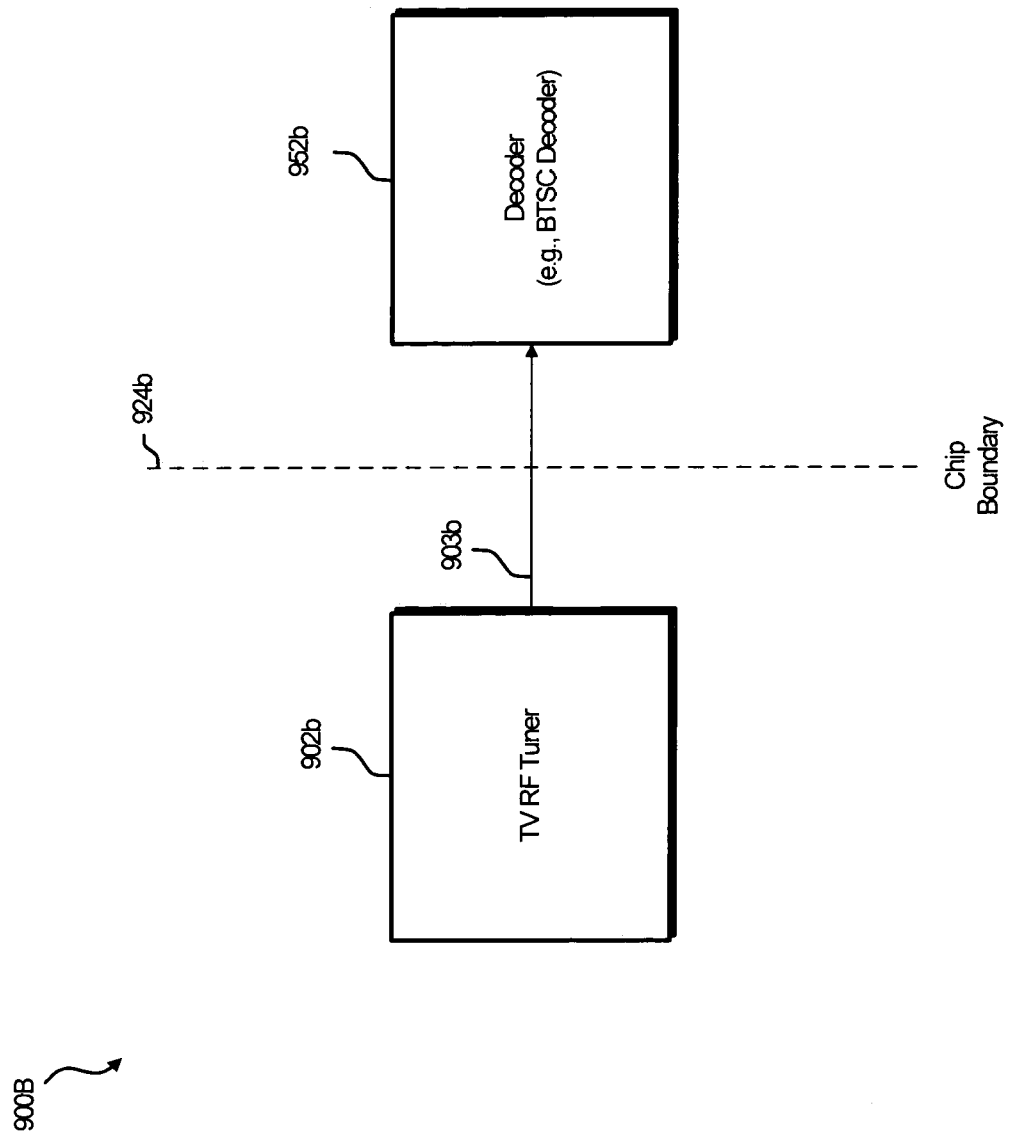
FIG. 8B illustrates a high level diagram of a signal processing system utilizing a TV tuner and audio signal decoder with a single IF strip, in accordance with an embodiment of the invention.

FIG. 8B illustrates a high-level diagram of a signal processing system utilizing a TV tuner and audio signal decoder with a single IF strip, in accordance with an embodiment of the invention. Referring to FIG. 8B, the signal processing system 900B may comprise a TV RF tuner 902b and a decoder 952b. The tuner 902b may be off-chip and the decoder 952b may be on-chip, which is illustrated by the chip boundary 924b. The tuner 902b may comprise suitable circuitry, logic, and/or code and may be adapted to acquire RF signals and generate analog and/or digital television signals. The decoder 952b may comprise suitable circuitry, logic, and/or code and may be adapted to decode analog audio signals received from the tuner 902b. In one embodiment of the invention, the decoder 952b may comprise a Broadcast Television Systems Committee (BTSC) decoder for decoding digitized analog audio signals.

In another embodiment of the invention, the tuner 902b may communicate analog television signals, such as analog audio signals, for on-chip processing and decoding by the decoder 952b via a single processing path, or a single IF strip 903b. The single IF strip 903b may also be utilize for communicating digital television signals for on-chip processing by the signal processing system 900B.

Figure 8C:
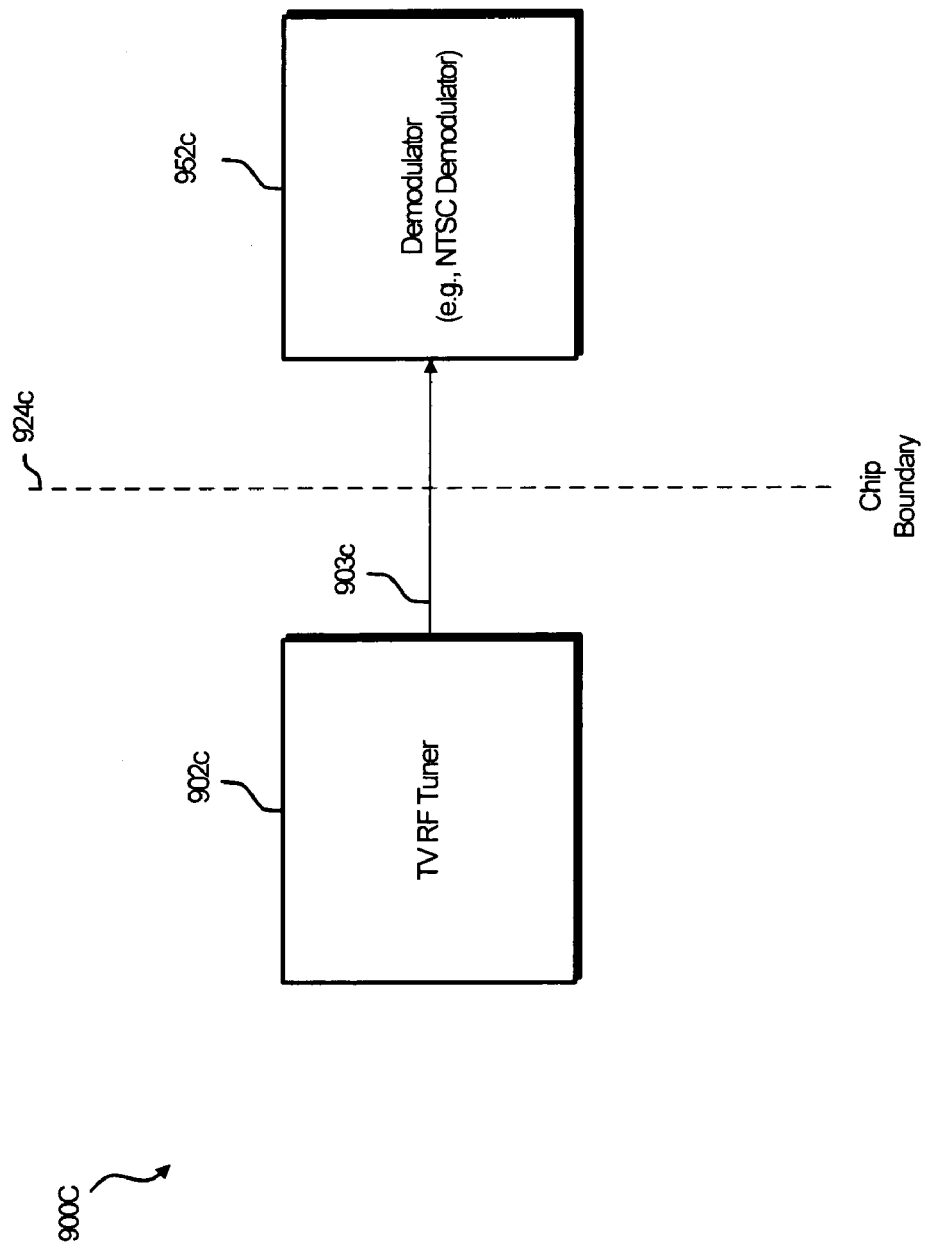
FIG. 8C illustrates a high level diagram of a signal processing system utilizing a TV tuner and video signal demodulator with a single IF strip, in accordance with an embodiment of the invention.

FIG. 8C illustrates a high level diagram of a signal processing system utilizing a TV tuner and video signal demodulator with a single IF strip, in accordance with an embodiment of the invention. Referring to FIG. 8C, the signal processing system 900C may comprise a TV RF tuner 902c and a demodulator 952c. The tuner 902c may be off-chip and the demodulator 952c may be on-chip, which is illustrated by the chip boundary 924c. The tuner 902c may comprise suitable circuitry, logic, and/or code and may be adapted to acquire RF signals and generate analog and/or digital television signals. The demodulator 952b may comprise suitable circuitry, logic, and/or code and may be adapted to demodulate analog television signals, which may be received from the tuner 902c. Demodulated analog signals may be subsequently decoded to generate output audio and/or video television signals. In one embodiment of the invention, the demodulator 952c may comprise an NTSC demodulator for demodulating NTSC analog television signals.

In another embodiment of the invention, the tuner 902c may communicate analog television signals for on-chip processing and demodulating by the demodulator 952c via a single processing path, or a single IF strip 903c. The single IF strip 903c may also be utilized to communicate digital television signals for on-chip processing by the signal processing system 900C.

Figure 8D:
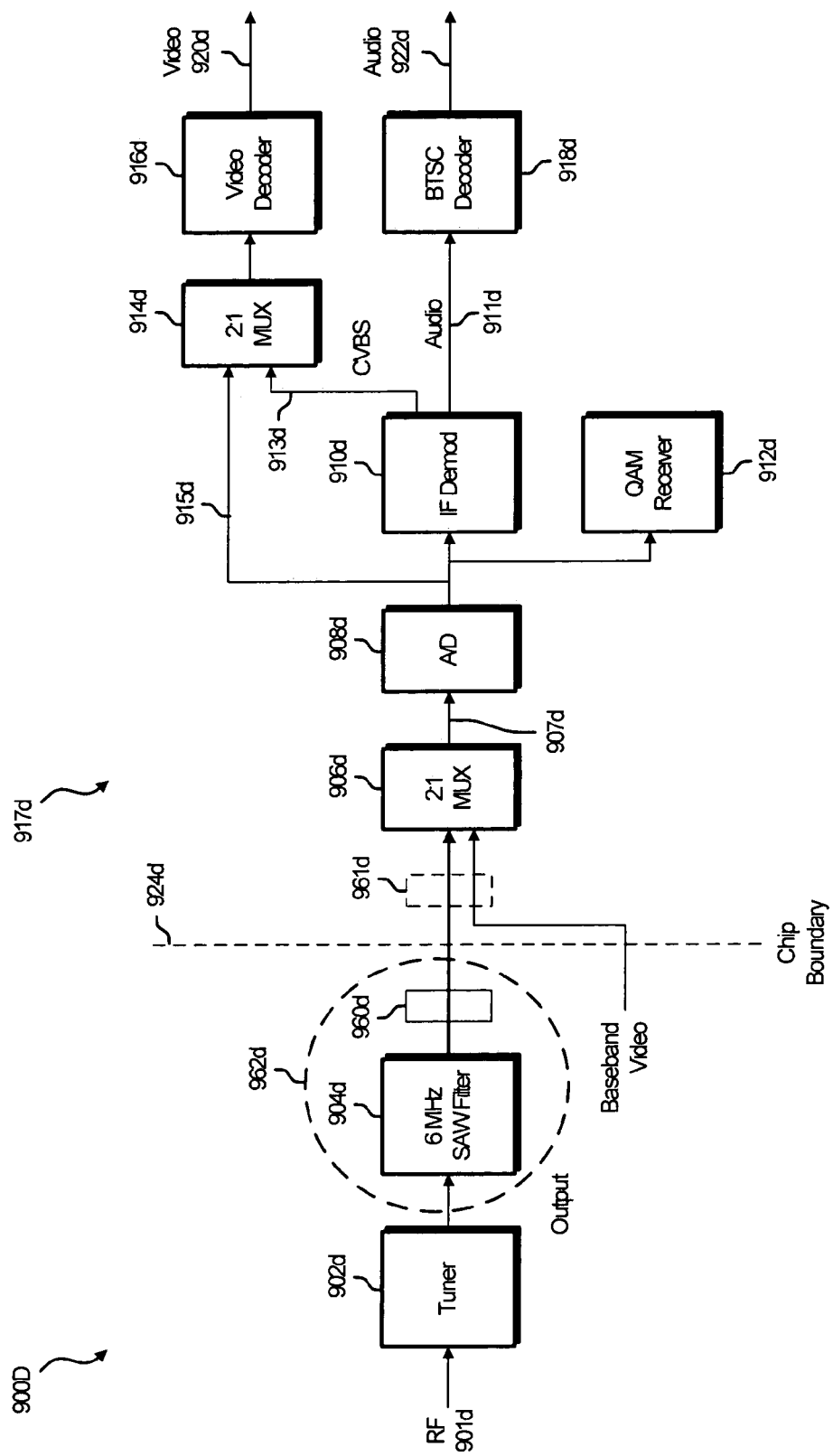
FIG. 8D illustrates a television receiver for processing analog and digital signals utilizing a single IF strip, in accordance with an embodiment of the invention.

FIG. 8D illustrates a television receiver for processing analog and digital signals utilizing a single IF strip, in accordance with an embodiment of the invention. Referring to FIG. 8D, the exemplary television receiver 900D may comprise an RF tuner 902d, a single IF strip 962d and an IF processor 917d. The single IF strip 962d may comprise a surface acoustic wave (SAW) filter 904d and an amplifier 960d. The IF processor 917d may comprise an IF demodulator 910d, an analog-to-digital (A/D) converter 908d, a quadrature amplitude modulation (QAM) receiver 912d, multiplexers 906d and 914d, a Broadcast Television Systems Committee (BTSC) decoder 918d, and a video decoder (VDEC) 916d. The IF processor 917d may be configured on a single semiconductor substrate, as indicated by the chip boundary line 924d.

Even though the filter 904d comprises a SAW filter, the present invention may not be so limited. Accordingly, other types of filters may also be utilized, in accordance with an embodiment of the invention. Even though the decoder 918d comprises a BTSC decoder, the present invention may not be so limited. Accordingly, other types of decoders may also be utilized, in accordance with an embodiment of the invention.

The SAW filter 904d may comprise suitable circuitry, logic, and/or code and may be adapted to filter analog and/or digital signals received from the TV tuner 902d. For example, the SAW filter 904d may be adapted to filter analog video signals, such as NTSC video signals, or the SAW filter 904d may be adapted to filter digital signals. In one embodiment of the invention, the SAW filter 904d may be a 6 MHz SAW filter for filtering digital television signals. In one embodiment of the invention, the single IF strip 962d may comprise two or more filters for filtering analog and/or digital television signals received from the tuner 902d.

The amplifier 960d may comprise suitable circuitry, logic, and/or code and may be adapted to amplify the filtered television signal generated by the SAW filter 904d. Furthermore, even though the single IF strip 962d utilizes an off-chip amplifier 960d, the present invention may not be so limited and the amplifier 960d may be also implemented as an on-chip amplifier 961d.

The A/D converter 908d may comprise suitable circuitry, logic, and/or code and may be adapted to convert analog television signals received from the multiplexer 906d to digital signals for further processing. The IF demodulator 910d may comprise suitable circuitry, logic, and/or code and may be adapted to demodulate analog television signal received from the A/D converter 908d and generate an analog audio signal 911d and an analog video signal 913d.

The QAM receiver 912d may comprise suitable circuitry, logic, and/or code and may be adapted to process an output of the A/D converter 908d that includes quadrature amplitude modulation (QAM) data. In one embodiment of the invention, the IF demodulator 910d and the QAM receiver 912d may be adapted to utilize common circuit elements.

In operation, the tuner 902d may receive an RF input signal 901d having a plurality of channels, for example, TV channels that are spaced 6 MHz apart. The RF tuner 902d may select and down-convert a desired channel to an IF signal. For example, the IF signal may be at a frequency of 36 MHz, 44 MHz, or some other IF frequency. The SAW filter 904d within the single IF strip 962d, may receive the IF signal from the tuner 902d and may filter the IF signal to remove any remaining unwanted channels. In one embodiment of the invention, the tuner 902d may be implemented on a single substrate, as further described in "Digital IF Demodulator For Video Applications", U.S. patent application Ser. No. 09/739,349, filed on Dec. 15, 2000, which is incorporated herein by reference in its entirety.

The filtered IF signal may be amplified by the amplifier 960d within the single IF strip 962d. The IF processor 917d may receives the amplified IF signal from the amplifier 960d and may demodulate the IF signal to generate a digital video signal 920d and a digital audio signal 922d, that carry for example TV programming or other information. As indicated by the chip boundary 924d, the IF processor 917d may be configured on a single substrate, such as for example a CMOS substrate.

The multiplexer 906d in the IF processor 917d may multiplex the IF signal from the amplifier 960d with any baseband video signal that may be present to produce an analog IF input signal 907d, which may be communicated to the A/D converter 908d. The A/D converter 908d may digitize the output of the multiplexer 906d. The IF demodulator 910d may receive the digitized output from the A/D converter 908d, and may down-convert the AND converter 908d output to produce a digital video signal 913d and a digital audio signal 911d. The digital audio signal 911d may be a BTSC-compatible digital audio signal, for example, and the digital video signal 913d may be a composite video broadcasting signal (CVBS), for example. The BTSC decoder 918d may receive the digital audio output 911d from the IF demodulator 910d and may generate a decoded audio output signal 922d. The multiplexer 914d may receive the digital video output signal 913d from the IF demodulator 910d and may multiplex it with the output from the A/D converter 908d. A video decoder 916d may decode the output of the multiplexer 914d to produce the video output signal 920d.

In one embodiment of the invention, the IF demodulator 910d may be adapted to process both an NTSC analog video signal (or a PAL signal or a SECAM signal), along with a digital television signal, such as a QAM television signal, for example. Such flexibility may simplify the front end receiver requirements by unifying the signal path prior to the demodulator 910d and utilizing a single IF strip 962d, thereby reducing implementation costs and increasing processing efficiency.

Figure 8E:
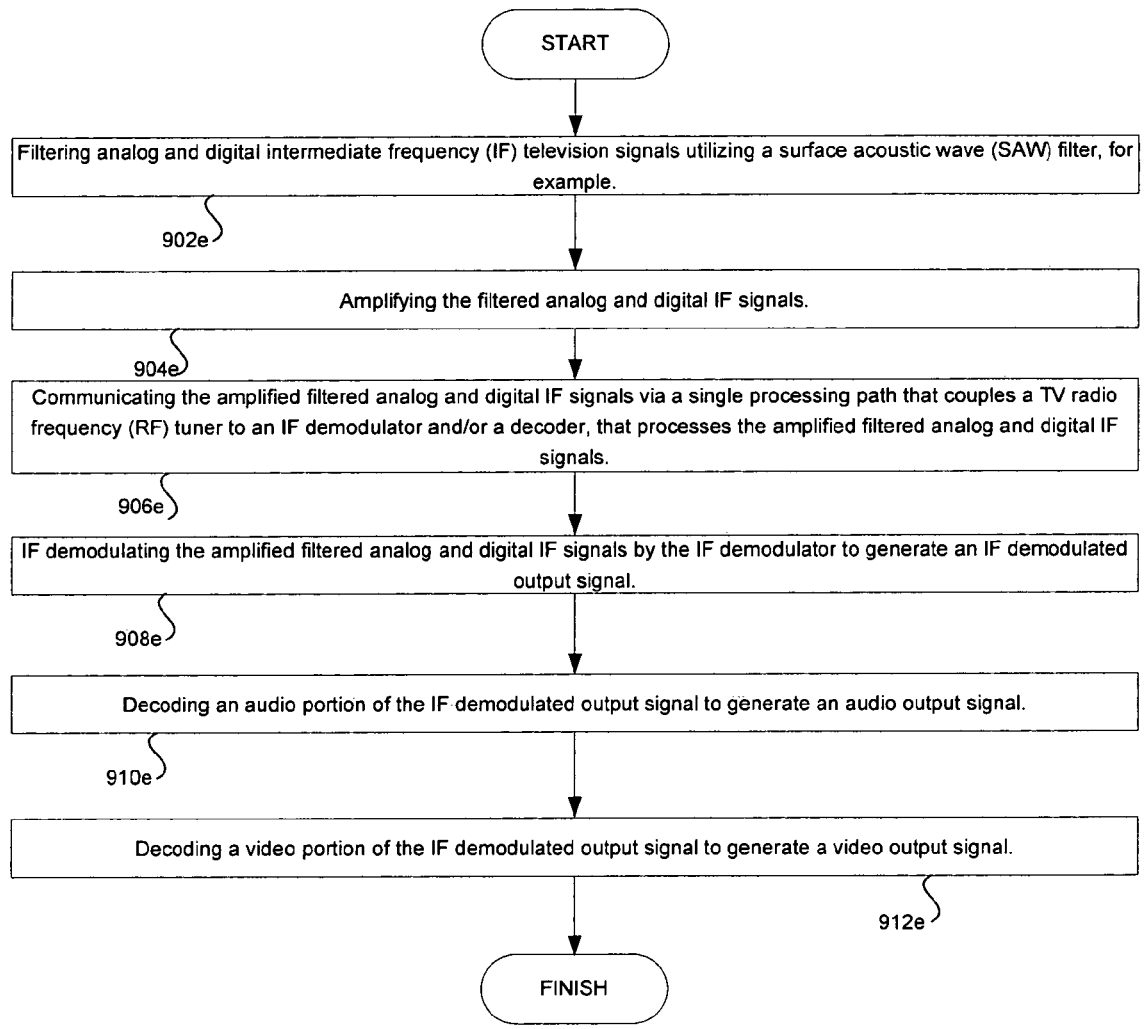
FIG. 8E is a flow diagram illustrating exemplary steps for processing television signals, in accordance with an embodiment of the invention.

FIG. 8E is a flow diagram illustrating exemplary steps for processing television signals, in accordance with an embodiment of the invention. Referring to FIGS. 8D and 8E, at 902e, analog and digital intermediate frequency (IF) television signals may be filtered utilizing a surface acoustic wave (SAW) filter 904d, for example. At 904e, the filtered analog and digital IF signals generated by the filter 904d may be amplified by the amplifier 960d within the single IF strip 962d. At 906e, the amplified filtered analog and digital IF signals may be communicated via the single IF strip 962d to the IF processor 917d. The single IF strip 962d may couple the TV radio frequency (RF) tuner 902d to the IF processor 917d that processes the amplified filtered analog and digital IF signals. At 908e, the amplified filtered analog and digital IF signals may be IF demodulated by the IF demodulator 910d to generate an IF demodulated video output signal 913d and an IF demodulated audio output signal 911d. At 910e, the IF demodulated audio output signal 911d may be decoded to generate an audio output signal 922d. At 912e, the IF demodulated video output signal 913d may be decoded to generate a video output signal 920d.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing television signals, the method comprising:

communicating analog and digital signals via a single processing path that couples a TV radio frequency (RF) tuner to one or both of a demodulator and/or a decoder, wherein said one or both of said demodulator and/or said decoder processes said analog and digital signals, and wherein said TV RF tuner is coupled to said one or both of said demodulator and/or said decoder only via said single processing path; and multiplexing said communicated analog and digital signals with a baseband video signal prior to said processing of said analog and digital signal by said one or both of said demodulator and/or said decoder.

2. The method according to claim 1, comprising filtering said analog and digital signals.

3. The method according to claim 2, wherein said filtering utilizes a surface acoustic wave (SAW) filter.

4. The method according to claim 2, comprising amplifying said filtered analog and digital signals.

5. The method according to claim 4, comprising receiving said amplified filtered analog and digital signals.

6. The method according to claim 4, comprising demodulating said amplified filtered analog and digital signals by said demodulator to generate a demodulated output signal.

7. The method according to claim 6, comprising decoding an audio portion of said demodulated output signal.

8. The method according to claim 7, wherein said decoding is achieved via a Broadcast Television Systems Committee (BTSC) decoder.

9. The method according to claim 6, comprising multiplexing at least a portion of said amplified filtered analog and digital signals and a video portion of said demodulated output signal to generate a multiplexed signal.

10. The method according to claim 9, comprising decoding a video portion of said multiplexed signal.

11. A system for processing television signals, the system comprising a single processing path that communicates analog and digital signals from a TV radio frequency (RF) tuner to one or both of a demodulator and/or a decoder, wherein said one or both of said demodulator and/or said decoder processes said analog and digital signals, and wherein said TV RF tuner is coupled to said one or both of said demodulator and/or said decoder only via said single processing path; and
 a multiplexer that enables multiplexing of said communicated analog and digital signals with a baseband video signal prior to said processing of said analog and digital signal by said at least one of the following: said demodulator and said decoder.

12. The system according to claim 11, comprising a filter that filters said analog and digital signals.

13. The system according to claim 12, wherein said filter is a surface acoustic wave (SAW) filter.

14. The system according to claim 12, comprising an amplifier that amplifies said filtered analog and digital signals.

15. The system according to claim 14, comprising a demodulator that receives said amplified filtered analog and digital signals.

16. The system according to claim 14, comprising a demodulator that demodulates said amplified filtered analog and digital signals to generate a demodulated output signal.

17. The system according to claim 16, comprising an audio decoder that decodes an audio portion of said demodulated output signal.

18. The system according to claim 17, wherein said audio decoder is a Broadcast Television Systems Committee (BTSC) decoder.

19. The system according to claim 16, comprising a multiplexer that multiplexes at least a portion of said amplified filtered analog and digital signals and a video portion of said demodulated output signal to generate a multiplexed signal.

20. The system according to claim 19, comprising a video decoder that decodes a video portion of said multiplexed signal.

21. A method for processing television signals, the method comprising:
 communicating analog and digital signals via a single processing path that couples a TV radio frequency (RF) tuner to one or both of a demodulator and/or a decoder;
 filtering said analog and digital signals;
 amplifying said filtered analog and digital signals;
 demodulating said amplified filtered analog and digital signals by said demodulator to generate a demodulated output signal; and
 multiplexing at least a portion of said amplified filtered analog and digital signals and a video portion of said demodulated output signal to generate a multiplexed signal,
 wherein said one or both of said demodulator and said decoder processes said analog and digital signals.

22. The method according to claim 21, comprising decoding a video portion of said multiplexed signal.

23. A system for processing television signals, the system comprising:
 a single processing path that communicates analog and digital signals from a TV radio frequency (RF) tuner to one or both of a demodulator and/or a decoder;
 a filter that filters said analog and digital signals;
 an amplifier that amplifies said filtered analog and digital signals;
 a demodulator that demodulates said amplified filtered analog and digital signals to generate a demodulated output signal; and
 a multiplexer that multiplexes at least a portion of said amplified filtered analog and digital signals and a video portion of said demodulated output signal to generate a multiplexed signal,
 wherein said one or both of said demodulator and/or said decoder processes said analog and digital signals.

24. The system according to claim 23, comprising a video decoder that decodes a video portion of said multiplexed signal.

* * * * *